(12) United States Patent
John et al.

(10) Patent No.: US 10,683,988 B2
(45) Date of Patent: Jun. 16, 2020

(54) MIRRORED LED LIGHTING

(71) Applicant: Elemental LED, Inc., Reno, NV (US)

(72) Inventors: Matthew John, Reno, NV (US);
Jeffrey L. Kuo, Sparks, NV (US);
Andrew Lassen, Reno, NV (US);
Travis Irons, Reno, NV (US); Adam L. Pruitt, Reno, NV (US)

(73) Assignee: Elemental LED, Inc., Reno, NV (US)

( * ) Notice: Subject to any disclaimer, the term of this patent is extended or adjusted under 35 U.S.C. 154(b) by 0 days.

(21) Appl. No.: 16/457,242

(22) Filed: Jun. 28, 2019

(65) Prior Publication Data

US 2020/0109834 A1 Apr. 9, 2020

Related U.S. Application Data

(60) Provisional application No. 62/741,479, filed on Oct. 4, 2018.

(51) Int. Cl.
| | | |
|---|---|---|
| *F21V 7/00* | (2006.01) | |
| *F21V 7/28* | (2018.01) | |
| *F21V 3/00* | (2015.01) | |
| *F21Y 115/10* | (2016.01) | |
| *F21Y 103/10* | (2016.01) | |

(52) U.S. Cl.
CPC ............. *F21V 7/005* (2013.01); *F21V 3/00* (2013.01); *F21V 7/28* (2018.02); *F21Y 2103/10* (2016.08); *F21Y 2115/10* (2016.08)

(58) Field of Classification Search
CPC ... F21V 7/005; F21V 7/28; F21V 3/00; F21Y 2103/10; F21Y 2115/10

USPC .......................................................... 362/223
See application file for complete search history.

(56) References Cited

U.S. PATENT DOCUMENTS

| | | | |
|---|---|---|---|
| 10,078,180 | B1 | 9/2018 | Wasserman et al. |
| D849,277 | S | 5/2019 | John |
| D849,278 | S | 5/2019 | John |
| 2005/0243576 | A1* | 11/2005 | Park .......................... F21K 9/00 362/612 |
| 2007/0200128 | A1 | 8/2007 | Yano |
| 2012/0287602 | A1 | 11/2012 | Urano |
| 2013/0223055 | A1* | 8/2013 | Holland .................. F21V 7/005 362/218 |
| 2014/0036489 | A1* | 2/2014 | Catalano .................. F21L 4/02 362/184 |
| 2014/0268810 | A1* | 9/2014 | Marquardt .............. F21V 5/008 362/308 |

(Continued)

FOREIGN PATENT DOCUMENTS

| | | |
|---|---|---|
| JP | 2014017303 A | 1/2014 |
| KR | 1020120122172 A | 11/2012 |

(Continued)

OTHER PUBLICATIONS

English translation of KR 2013-0136101 A (Dec. 2013).*

(Continued)

*Primary Examiner* — Cara E Rakowski
*Assistant Examiner* — Hana S Featherly
(74) *Attorney, Agent, or Firm* — United IP Counselors, LLC

(57) ABSTRACT

Linear lighting with a mirrored coating is disclosed, as is a luminaire including the linear lighting.

11 Claims, 4 Drawing Sheets

(56) References Cited

U.S. PATENT DOCUMENTS

| | | | | |
|---|---|---|---|---|
| 2014/0306599 A1* | 10/2014 | Edwards | ................... | F21V 3/02 |
| | | | | 313/502 |
| 2015/0009649 A1* | 1/2015 | Jagt | ...................... | H01L 33/507 |
| | | | | 362/84 |
| 2015/0145406 A1* | 5/2015 | Li | ............................. | F21V 3/02 |
| | | | | 313/502 |

FOREIGN PATENT DOCUMENTS

| | | | |
|---|---|---|---|
| KR | 1020130111996 A | | 10/2013 |
| KR | 20130136101 A | * | 12/2013 |

OTHER PUBLICATIONS

International Search Report issued in International Patent Application No. PCT/US2019/054252 dated Feb. 7, 2020.
Written Opinion issued in International Patent Application No. PCT/US2019/054252 dated Feb. 7, 2020.

* cited by examiner

MIRRORED LED LIGHTING

CROSS-REFERENCE TO RELATED APPLICATIONS

This application claims priority to U.S. Provisional Application No. 62/741,479, filed Oct. 4, 2018, the contents of which are incorporated by reference in their entirety. This application is also related to U.S. Design application Ser. Nos. 29/665,346 and 29/665,352, both filed Oct. 2, 2018, and now U.S. Pat. Nos. D849,277 and D849,278, respectively. Both of those applications are incorporated by reference in their entireties as well.

BACKGROUND OF THE INVENTION

1. Field of the Invention

The invention relates to mirrored LED lighting.

2. Description of Related Art

Lighting based on light-emitting diodes (LEDs) usually comprises a number of LED light engines arranged on a printed circuit board (PCB). The PCB may also include circuits for controlling or driving the LED light engines. The LED light engine itself includes one or more LEDs in a package. Depending on the nature of the LED light engine, the package may also include a phosphor that absorbs the light emitted by the LEDs and emits light of a broader or different spectrum. This is often the case with so-called "white light" LED light engines, which often have blue-emitting LEDs and a phosphor that converts the blue light to light of a broader, "white light" spectrum.

Linear lighting is a type of LED lighting in which a number of LED light engines are arranged on a long, thin PCB at a regular spacing or pitch. The PCB may be either rigid or flexible. Segments of long, thin PCB may be joined together mechanically and electrically, typically at overlapping joints, to make a strip of linear lighting of arbitrarily long length.

Linear lighting is growing in popularity because of its versatility. Simply put, linear lighting can go places that traditional incandescent and fluorescent lighting cannot. It can be used as the primary lighting for a room, or for more localized task or accent lighting. A basic luminaire, the technical term for a complete light fixture, is sometimes constructed by, e.g., placing a strip of linear lighting in an extruded channel and covering the channel with a diffuser. Linear lighting is also sometimes used as a raw material to produce more complex luminaires, like light-guide panels (LGPs) and replacements for traditional incandescent and fluorescent fixtures.

One basic consideration for any type of light source is how well that light source produces visible light. Luminous efficacy is the usual term used to describe how well a light source produces visible light, and it is usually expressed in units of luminous flux per unit of input power, such as lumens per watt. Lighting engineers consider both the luminous efficacy of the light source, in this case, the LED light engines, and the luminous efficacy of the luminaire as a whole. When operated under typical conditions, LED light engines themselves are usually more efficacious than, e.g., legacy incandescent lamps. However, the luminous efficacy of LED luminaires as a whole may be much lower than the luminous efficacy of the LED light engines alone. Linear LED luminaires that produce more useable light, and thus, have a greater luminous efficacy, are desirable.

SUMMARY OF THE INVENTION

One aspect of the invention relates to LED linear lighting. In the LED linear lighting, the printed circuit board (PCB) has a mirror finish. In one embodiment, the mirror finish may be a film applied to the PCB, such as a specular film. In another embodiment, the mirror finish may be a piecewise-continuous mirror coating that is applied in pieces, e.g., using surface mount technology. The mirror finish may also be created by polishing, treating, or otherwise working a surface of the PCB, or by applying an interference filter coating, a dichroic coating, or another similar type of coating that selectively reflects light.

In yet another embodiment, the LED linear lighting includes a number of LED light engines. Each of the LED light engines has a horizontally-extending flange. An upper surface of the horizontally-extending flange has a mirror finish that, when the plurality of LED light engines is installed, serves as a portion of the mirrored coating.

Another aspect of the invention relates to an LED luminaire including, a channel, mirrored LED linear lighting in the channel, and a covering over the channel. The covering may be a diffuser.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the invention, and in which.

DETAILED DESCRIPTION

Figure 1:
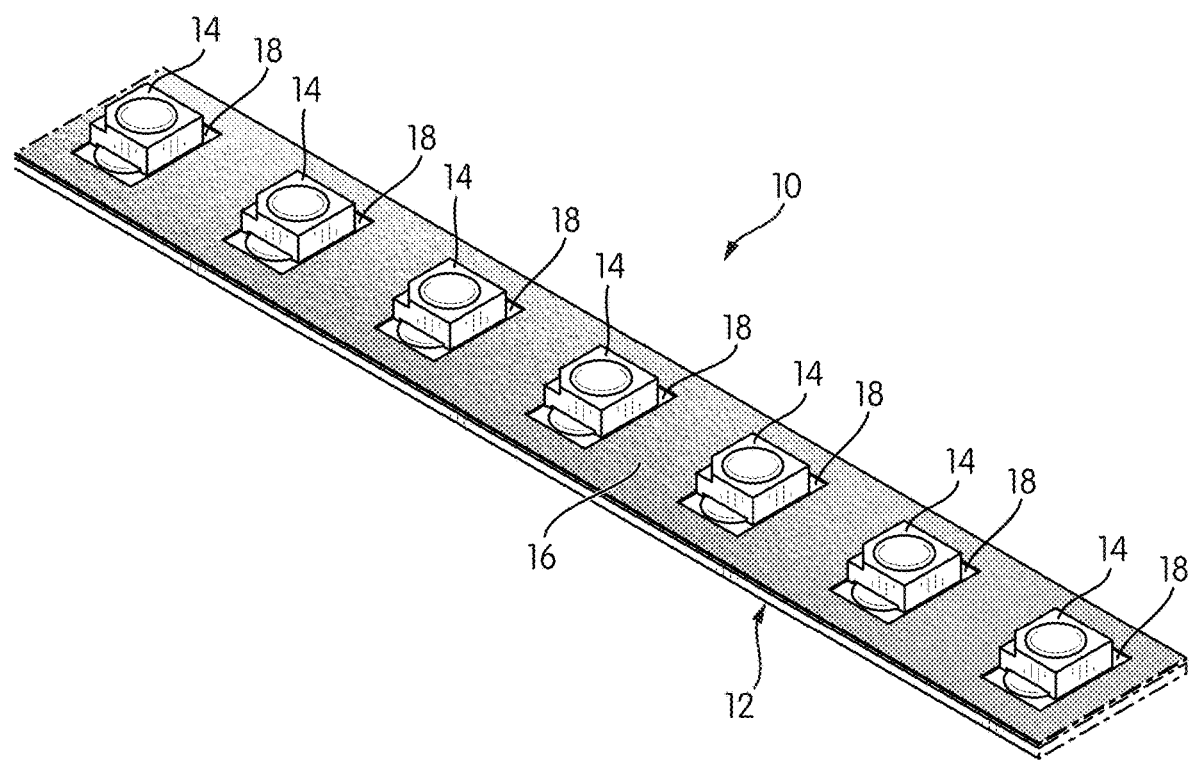
FIG. 1 is a perspective view of a strip of mirrored LED linear lighting.
Figure 2:
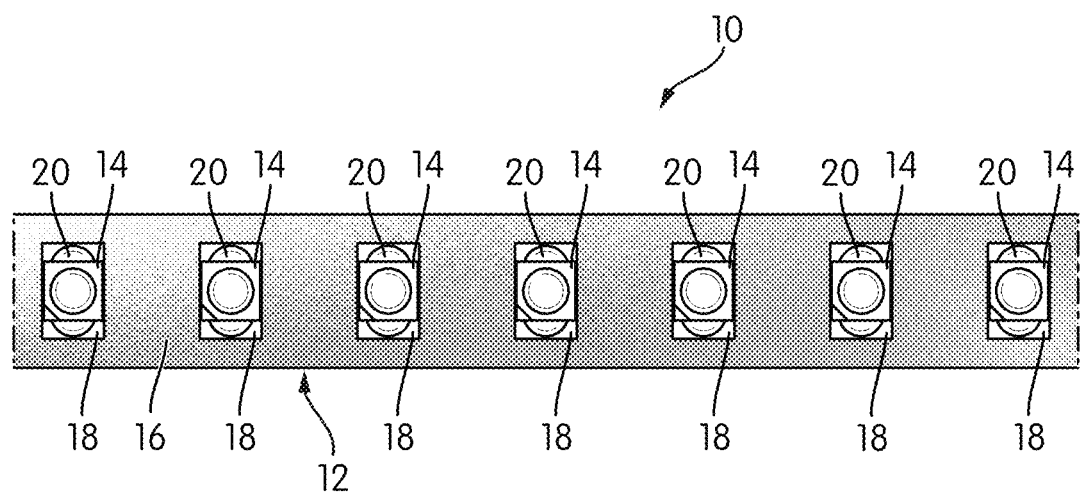
FIG. 2 is a top plan view of the strip of mirrored LED linear lighting of FIG. 1.

FIG. 1 is a perspective view of a strip of mirrored LED linear lighting, generally indicated at 10, according to one embodiment of the invention, and FIG. 2 is a top plan view of the linear lighting 10. The linear lighting 10 has a printed circuit board (PCB) 12, on which a number of LED light engines 14 are mounted. The PCB 12 has an upper surface with a mirror finish 16.

As the term is used here, the term "LED light engine" refers to one or more LEDs that are packaged such that they are suitable for mounting on a PCB. The package is typically plastic, and usually uses sets of fine wires to connect between the LEDs and one or more external connectors. In many cases, the package, which is typically plastic, is adapted to be surface mounted on the PCB and the external connectors are solder pads, although an LED package may be mounted in other ways. If the LED light engines are intended to emit "white" light, the LEDs themselves may be, e.g., blue-light emitting, and the package may be topped by a phosphor that absorbs the blue light from the LEDs and re-emits light of a broader spectrum.

When the LED light engines 14 emit light, some of that light will hit the PCB 12 directly or indirectly. The present inventors have found that when the PCB 12 has a mirror finish 16 on an upper surface, the luminous efficacy of the luminaire increases. As the terms "mirror" and "mirrored" are used here, they refer particularly to a surface that produces a specular reflection. Although the PCB of some linear lighting is, e.g., painted white to increase its reflectance, the reflection produced by this kind of PCB is diffuse reflection which, the present inventors have found, results in a lower luminous efficacy for the luminaire than a mirror finish.

The PCB 12 itself may be flexible or rigid. If flexible, it may be made of, e.g., polyimide or Mylar. If rigid, it may be made of FR4, aluminum, or any other suitable material. Typically, linear lighting 10 of this type is manufactured by surface-mounting LED light engines 14 (and other components, if necessary) on a rectangular PCB of defined dimensions, e.g., 650 or 750 mm by 300 mm, and then cutting that rectangular PCB into strips. Individual strips are then joined into a strip of linear lighting 10 of arbitrary length by using overlapping solder joints. Of course, while most manufacturing processes use surface-mount technologies, other mounting and manufacturing methods may be used.

Depending on the embodiment, the mirror finish 16 may be applied as a film, sprayed, painted, deposited or otherwise applied on the PCB 12. As will be described below in more detail, an existing surface of the PCB 12 may alternatively be polished, treated, or otherwise worked to create the mirror finish 16, if the material of which the PCB 12 is made is amenable to such treatment. Typically, those operations would be performed before surface-mounting components on the PCB 12.

If desired, however, the mirror finish 16 may be added after manufacture, for example, by applying an adhesive-backed mirrored film to the PCB 12, e.g., over the existing bare or screen-printed surface. The mirrored film may be cut, e.g., die cut, to accommodate the positions of the LED light engines 14 and any other components that may be on the PCB 12. If a mirrored film is added as the mirror finish 16 after the components are mounted on the PCB 12, the mirrored film may cover some or all non-light emitting components on the PCB 12.

If a mirrored film is used as the mirror finish 16, the mirrored film may be of a variety of different types. As one example, the mirrored film may be a specular film manufactured by 3M, Inc. (Maplewood, Minn., U.S.), such as D50A specular film, or it may be another type of metallized polymer film. In the embodiment of FIGS. 1 and 2, the mirror finish 16 is a mirrored film. The mirrored film 16 covers all components that may be on the PCB 12 other than the LED light engines 14 themselves. The mirrored film 16 has openings 18 that are cut large enough to expose both the LED light engines 14 and their respective solder pads 20.

Figure 3:
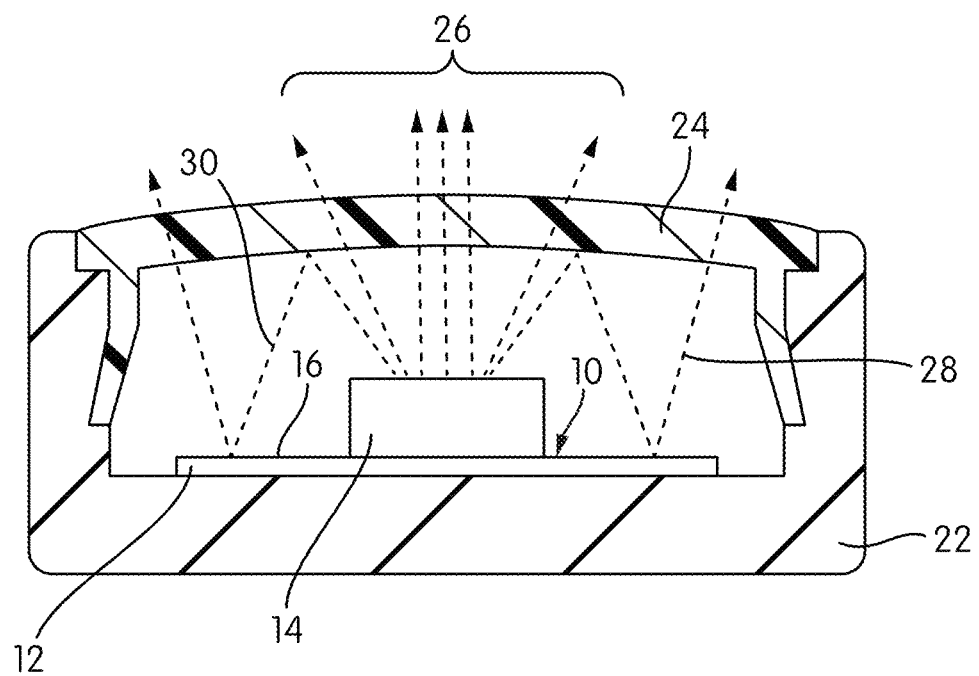
FIG. 3 is a cross-sectional view of the strip of mirrored LED linear lighting of FIG. 1 installed in a channel with a diffuser.

FIG. 3 is a cross-sectional view of the linear lighting 10 installed in a channel 22 with a covering 24 installed in the channel 22 overtop the linear lighting 10. In the illustrated embodiment, the covering 24 is an extruded plastic diffuser, and the remainder of this description may refer to it as such. However, the covering 24 may be a clear glass or plastic covering without light-diffusing properties or, alternatively, an optic with or without light-diffusing properties. The channel may be made of metal or plastic.

While the mirror finish 16 may have some effect when the linear lighting 10 is used alone, it may be particularly useful in an arrangement like the arrangement of FIG. 3. While the inventor does not wish to be bound by any particular theory of operation, a typical LED light engine 14 emits light in all directions. Plastic, glass, and other such materials that are used as diffusers typically have an index of refraction much greater than that of air, meaning that for any common diffuser material, there is a refractive critical angle. A ray of light that hits the diffuser at an angle less than that of the critical angle will pass through; a ray of light that hits the diffuser at an angle greater than the critical angle will be reflected back.

This is shown in FIG. 3, which includes a simplified, schematic light ray diagram. A group of light rays 26 emitted by the LED light engines 14 hit the diffuser at less than the critical angle and pass through without incident. However, some rays 28, 30 hit the diffuser 24 at greater than the critical angle and reflect back into the channel 28. At least some of these rays 28, 30 will reflect again off of the mirror finish 16 on the PCB 12 and will pass through the diffuser 24.

Although the inventors do not wish to be bound by any particular theory of operation, the mirror finish 16 may increase the amount of light that can be extracted from the linear lighting 10 by decreasing the amount of scattering or diffuse reflection that occurs when light rays 28, 30 reflect from the PCB 12. This may be considered to be a form of what is colloquially referred to as "photon herding" in the optical arts—minimizing the number of reflections as well as controlling the types of reflections and other optical interactions that occur in order to maximize the amount of useful light that is emitted.

While aspects of this description focus on the installation of a mirror finish 16 on a linear PCB 12, such mirrored finishes, coatings, or other treatments may be applied to any type or shape of PCB, and may be used in forms of LED-based lighting other than linear lighting.

EXAMPLES

In the following examples, all lighting products, channels, and diffusers were sourced from Elemental LED, Inc. (Reno, Nev., United States). All linear lighting without a mirrored coating had a PCB with a white, screen-printed upper surface.

Example 1

A 14-inch strip of 24V BLAZE™ linear lighting was installed in an 18-inch clear-anodized aluminum SLIM™ channel and covered with a diffuser. The assembled luminaire was placed in a calibrated Gamma Scientific 60-inch integrating sphere for photometric testing according to LM-79-08 and TM-30-15 (Illuminating Engineering Society, New York, N.Y., United States), the contents of which are incorporated by reference in their entirety. Standard photometrics, including luminous flux, were recorded.

Example 2

A 14-inch strip of 24V BLAZE™ linear lighting was covered with D50A 3M specular film cut as shown in FIGS. 1 and 2 to expose the light engines on the lighting. The sample was installed in a SLIM™ channel with a diffuser as described above in Example 1, placed in the integrating sphere, and standard photometrics, including luminous flux, were recorded.

Example 3

An 18-inch strip of 24V VALENT X™ linear lighting was installed in an 18-inch clear-anodized aluminum SLIM™ channel and covered with a diffuser as described in Example 1. The assembled luminaire was placed in the integrating sphere, and standard photometrics, including luminous flux, were recorded.

Example 4

An 18-inch strip of 24V VALENT X™ linear lighting was covered with D50A 3M specular film to the left and right of the LED light engines. The close pitch of the LED light engines in this linear lighting prevented placement of the specular film between the individual LED light engines. The prepared linear lighting was then installed in a SLIM™ channel as described in Example 3 and placed in the integrating sphere. Standard photometrics, including luminous flux, were recorded.

Table 1 below gives the results for Examples 1-4.

TABLE 1

Results for Examples 1-4.

| Sample | CCT* | Ra | Rf | R9 | Luminous Flux (lm) |
|---|---|---|---|---|---|
| Example 1 | 2925 K | 93 | 90 | 71 | 194 |
| Example 2 | 2921 K | 93 | 90 | 70 | 202 |
| Example 3 | 2914 K | 94 | 90 | 68 | 661 |
| Example 4 | 2928 K | 94 | 90 | 68 | 669 |

*Correlated color temperature, in degrees Kelvin

The results of Examples 1-4 demonstrate a consistent increase in luminous flux of 8 lumens for both sets of examples when comparing examples without a mirror finish to examples with a mirror finish, in this case, an applied specular-reflective film. Other photometric parameters relating to color temperature (CCT) and color rendering fidelity (Ra and Rf) were essentially unchanged, and power draw was essentially the same with samples of the same material, which tends to confirm that the mirror finish is responsible for the increase in luminous flux.

Figure 4:
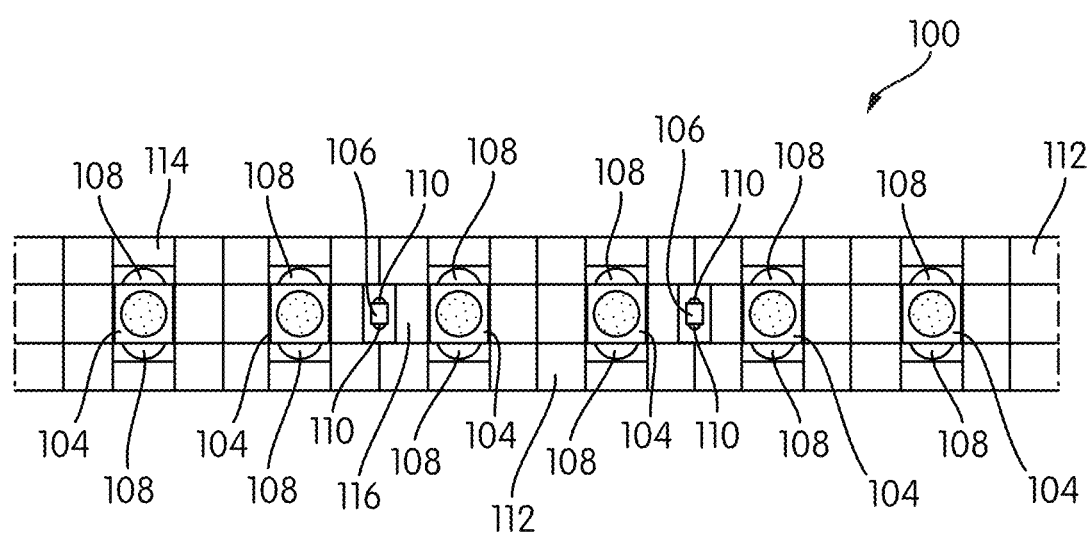
FIG. 4 is a top plan view of a strip of mirrored LED linear lighting with a piecewise-continuous mirrored coating according to another embodiment of the invention.

PCB with a mirror finish may be made in ways beyond those described above. For example, FIG. 4 is a top plan view of a segment of linear lighting, generally indicated at 100, according to another embodiment of the invention. The linear lighting 100 comprises a PCB 102, on which a plurality of LED light engines 104 are disposed at a regular pitch or interval. In the illustrated embodiment, the PCB 102 also has a number of resistors 106 mounted interstitially between the light engines 104. As those of skill in the art will understand, additional elements, like resistors 106, current controllers, and the like may only be necessary if the linear lighting 100 is to be operated as a constant-voltage device. If the linear lighting 100 is to be operated as a constant-current device, the PCB 102 may include only light engines 104.

Linear lighting 100 is typically manufactured using surface-mount technology (SMT). In SMT, components are mounted on the surface of the PCB 102, connected by solder pads to conductors that run along the PCB 102. The solder pads 108, 110 for the components are visible in the view of FIG. 4.

In a typical SMT process, the PCB 102 is prepared first, with solder pads 108, 110 formed at specific locations to receive specific components, typically by patterning and etching a sheet of conductive material to form both the solder pads and conductive traces. Solder paste is applied to the solder pads 108, 110. The surface-mount components, like the light engines 104 and resistors 106, are placed on their respective solder pads 108, 110 by a machine called a "pick-and-place" machine that uses a robotic arm to pick up a component and place it in the appropriate location on the PCB 102. An SMT "pick-and-place" machine usually has large reels of each component available to it, and may use machine vision systems to ensure that the components are placed accurately. Once all necessary components are placed, the resulting populated PCB 102 is sent to a solder reflow oven to turn the solder paste into solder and thus connect the mounted components mechanically and electrically to the PCB 102.

In linear lighting 100, a mirrored coating is applied as a mirror finish during SMT pick-and-place operations using the same techniques that are used to place the light engines 104 and resistors 106. The SMT pick-and-place machine may use, for example, specular film pre-cut into particular sizes and shapes, such as rectangles and squares. Those squares could be fixed to the PCB 102 with adhesive, or they could be made in such a way and with such a material that they will thermally fuse to the PCB 102 when the PCB 102 goes through the reflow oven. The result would be a piecewise-continuous mirror finish.

In FIG. 4, the PCB 102 has squares and rectangles of mirrored material of three different shapes covering substantially the entirety of the PCB 102. Squares 112 of mirrored material cover open areas of the PCB 102. Long rectangles 114 of material cover regions that are immediately around the light engines 104. Tall rectangles 116 cover the area immediately around the resistors 106. The result is a "patchwork quilt" of adjacent pieces of mirrored material. In the illustration of FIG. 4, the squares and rectangles 112, 114, 116 abut one another. Depending on the placement accuracy that the SMT pick-and-place machine can provide, in some cases, the squares and rectangles 112, 114, 116 may overlap one another to ensure that there are no gaps. The linear lighting 100 of FIG. 4 has the entirety of its PCB 102 covered with mirrored material, although in some embodiments, less than the entire surface area of the PCB 102 may be covered with the mirrored coating.

Figure 5:
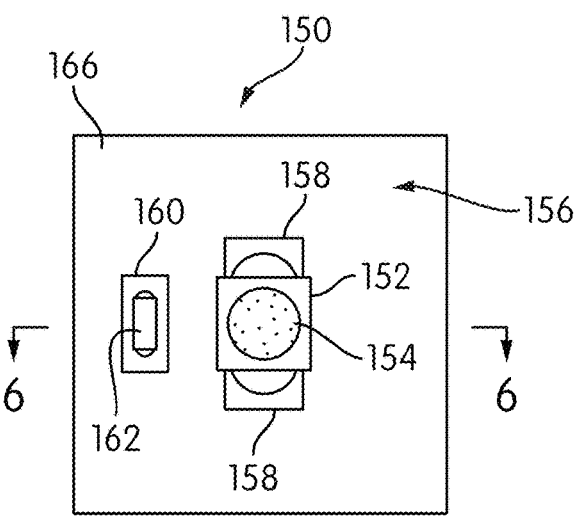
FIG. 5 is a top plan view of an LED light engine with a mirrored flange.

There are other ways of forming a piecewise-continuous mirror finish on a PCB. As another example, FIG. 5 is a top plan view of a single LED light engine, generally indicated at 150, according to another embodiment of the invention. At its center, the LED light engine 150 includes an LED package 152. The LED package 152 has the features of a typical LED package: it packages one or more LEDs and provides connections to power. As shown, the LED package 152 is topped by a phosphor 154 to convert light emitted by the LED or LEDs into light of a different or broader spectrum.

Connected to the LED package 152 and extending from it on all sides is a flange 156 with a mirror finish on its upper surface. The flange 156 has a square or rectangular shape overall, and may be of any size relative to the LED package 152. As shown, the flange 156 is considerably wider than the LED package 152, extending in each direction a distance greater than the width of the LED package 152 itself. In the present case, the flange 156 is attached along the entire length of two sides of the LED package 152, and is attached along at least a portion of the other two sides of the LED package 152. Although the flange 156 is generally continuous from the LED package 152 to its border, the flange 156 does include cut-outs of various sizes: in this case, a pair of rectangular cut-outs 158 arranged on opposite sides of the LED package 152 to allow for soldering at the solder pads, and a cut-out 160 some distance from the LED package 152 to allow clearance for surface-mounting a resistor 162, as will be explained below in more detail.

Figure 6:
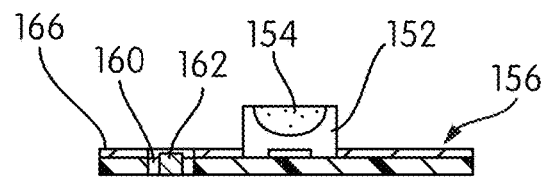
FIG. 6 is a cross-sectional view of the LED light engine, taken through Line 6-6 of FIG. 5.

FIG. 6 is a cross-sectional view of the LED light engine 150, taken through Line 6-6 of FIG. 5. As shown, the flange 156 of the illustrated embodiment comprises two layers: a base layer 164 and an upper layer 166. The base layer 164 would typically be made of the same material as the LED package 152, for example, high-density polyethylene or polypropylene. The base layer 164 would typically be thin: often less than 1 mm, and in some cases, less than 500 µm or 250 µm. It may be either rigid or flexible, that being determined at least in part by its thickness, as well as by the material of which it is made.

The upper layer 166 is a mirrored coating or film that produces a specular reflection. The upper layer 166 may comprise a metal or be metalized, or it may have any or all of the characteristics of the specular films described above. The upper layer 166 may be relatively thin; the view of FIG. 6 exaggerates the thickness of both layers 164, 166 in order to better illustrate them. Of course, the above assumes that the flange 156 is made of the same plastic material as the LED package 152 and cannot be polished or worked to create a mirror finish; if the flange 156 is made of a material that can be polished or worked to create a mirror finish, then an upper layer 166 comprised of an applied specular film may not be necessary.

Figure 7:
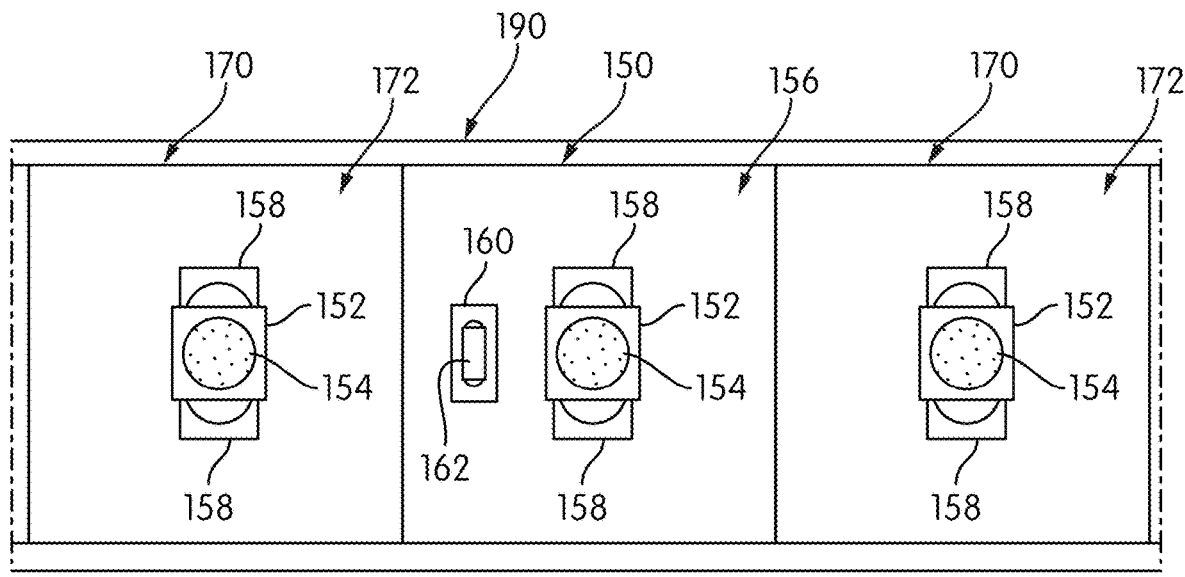
FIG. 7 is a top plan view of a PCB with multiple LED light engines with mirrored flanges.

The use of LED light engines 150 with mirrored flanges 156 is best illustrated with respect to FIG. 7, a top plan view of three LED light engines 150, 170 on a PCB 190. In the illustration of FIG. 7, the central LED light engine 150 has the features described above. The two LED light engines 170 that flank it to either side have a slightly different flange 172: the flange 172 of these LED light engines 170 does not include a cut-out 160 for a resistor 162 or other current-control device. The three LED light engines 150, 170 are arranged adjacent to and abutting one another, so as to leave little to no gap between respective LED light engines 150, 170. In essence, the PCB 190 is given a mirror finish by using the LED light engines 150, 170 to do so.

Some of the above description assumes that the mirror finish is provided by a specular film. However, that need not be the case in all embodiments. For example, if the PCB is made of a metal such as aluminum, or another material that can be polished, the PCB may simply be polished down to a mirror finish. Additionally, an interference filter coating or a dichroic filter coating could be used to produce a specular reflection. One potential advantage of these types of filter coatings in some applications is the ability to adjust the spectrum of the reflected light by choosing a filter, film, or coating that reflects only certain wavelengths of light.

While the invention has been described with respect to certain embodiments, the description is intended to be exemplary, rather than limiting. Modifications and changes may be made within the scope of the invention, which is defined by the appended claims.

What is claimed is:

1. Linear lighting, comprising:
    a narrow, elongate, flexible printed circuit board (PCB); and
    a plurality of LED light engines disposed on the PCB and spaced at a regular pitch, the upper surface of the PCB having a mirror finish;
    wherein each of the plurality of LED light engines includes a horizontally-extending flange, an upper surface of each of the horizontally-extending flanges having a mirror finish that, when the plurality of LED light engines is installed, serves as a portion of the mirror finish of the PCB.

2. The linear lighting of claim 1, wherein each of the horizontally-extending flanges is dimensioned such that the horizontally-extending flanges of adjacent ones of the plurality of LED light engines adjoin or overlap one another.

3. The linear lighting of claim 1, wherein each of the horizontally-extending flanges has one or more cut-outs sized for a component mounted on the PCB.

4. The linear lighting of claim 1, wherein the mirror finish comprises an interference coating or a dichroic coating.

5. A luminaire, comprising: a channel; linear lighting disposed within the channel, the linear lighting including a narrow, elongate; flexible printed circuit board (PCB); and a plurality of LED light engines disposed on the PCB and spaced at a regular pitch, the upper surface of the PCB having a mirror finish; and
    a covering adapted to cover the channel-;
    wherein each of the plurality of LED light engines includes a horizontally-extending flange, an upper surface of each of the horizontally-extending flanges having a mirror finish that, when the plurality of LED light engines is installed, serves as a portion of the mirror finish of the PCB.

6. The luminaire of claim 5, wherein the covering comprises a diffuser.

7. The luminaire of claim 5, wherein the channel comprises a bottom and a pair of opposed sidewalls that arise from the bottom.

8. The luminaire of claim 7, wherein the linear lighting is disposed on the bottom of the channel.

9. The luminaire of claim 5, wherein each of the horizontally-extending flanges is dimensioned such that the horizontally-extending flanges of adjacent ones of the plurality of LED light engines adjoin or overlap one another.

10. The luminaire of claim 5, wherein each of the horizontally-extending flanges has one or more cut-outs sized for a component mounted on the PCB.

11. The luminaire of claim 5, wherein the mirror finish comprises an interference coating or a dichroic coating.

* * * * *